United States Patent
Kamidi et al.

(10) Patent No.: US 8,279,407 B2
(45) Date of Patent: Oct. 2, 2012

(54) STAGE SYSTEM AND LITHOGRAPHIC APPARATUS COMPRISING SUCH STAGE SYSTEM

(75) Inventors: Ramidin Izair Kamidi, Eindhoven (NL); Henrikus Herman Marie Cox, Eindhoven (NL); Emiel Jozef Melanie Eussen, Eindhoven (NL); Ronald Casper Kunst, Geldrop (NL); Engelbertus Antonius Fransiscus Van Der Pasch, Oirschot (NL); Marcel François Heertjes, Best (NL); Mark Constant Johannes Baggen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 549 days.

(21) Appl. No.: 12/408,936

(22) Filed: Mar. 23, 2009

(65) Prior Publication Data

US 2009/0279067 A1 Nov. 12, 2009

Related U.S. Application Data

(60) Provisional application No. 61/065,000, filed on Apr. 8, 2008.

(51) Int. Cl.
*G03B 27/58* (2006.01)
*G03B 27/42* (2006.01)

(52) U.S. Cl. ............................ 355/72; 355/53
(58) Field of Classification Search ............ 355/53, 355/72–76
See application file for complete search history.

(56) References Cited

U.S. PATENT DOCUMENTS

| | | | |
|---|---|---|---|
| 7,238,931 B2 * | 7/2007 | Nabeshima et al. | 250/231.13 |
| 7,348,574 B2 | 3/2008 | Pril et al. | |
| 7,505,114 B2 | 3/2009 | Butler | |
| 7,576,832 B2 | 8/2009 | Kamidi et al. | |
| 7,630,059 B2 | 12/2009 | Butler et al. | |
| 7,657,334 B2 | 2/2010 | De Vos et al. | |
| 2006/0227309 A1 * | 10/2006 | Loopstra et al. | 355/53 |
| 2007/0052976 A1 * | 3/2007 | Pril et al. | 356/616 |
| 2007/0195296 A1 * | 8/2007 | Van Der Pasch et al. | 355/53 |
| 2008/0094593 A1 * | 4/2008 | Shibazaki | 355/53 |
| 2008/0200998 A1 | 8/2008 | Baggen et al. | |
| 2008/0246200 A1 | 10/2008 | Varvoordeldonk et al. | |

FOREIGN PATENT DOCUMENTS

| | | |
|---|---|---|
| JP | 2003-222512 A | 8/2003 |
| JP | 2006-013178 A | 1/2006 |
| JP | 2007-071874 A | 3/2007 |
| JP | 2007-110100 A | 4/2007 |
| JP | 2007-173808 A | 7/2007 |
| JP | 2007-318107 A | 12/2007 |
| JP | 2008-028392 A | 2/2008 |
| JP | 2008-199020 A | 8/2008 |
| JP | 2009-515107 A | 4/2009 |

OTHER PUBLICATIONS

English-Language Translation of Notice of Reasons for Rejection directed to related Japanese Patent Application No. 2009-088604, mailed Jun. 20, 2011, from the Japanese Patent Office; 3 pages.

* cited by examiner

*Primary Examiner* — Hung Henry Nguyen
(74) *Attorney, Agent, or Firm* — Sterne, Kessler, Goldstein & Fox P.L.L.C

(57) ABSTRACT

A stage system includes a movable stage, at least two encoder heads each constructed to provide an encoder signal representative of a position of the movable stage with respect to an encoder target structure, and a controller to control a position of the stage. The controller is provided with the encoder signals of each of the encoder heads. The controller is arranged to apply a weighting function to the encoder signals and to derive a position of the stage from the weighted encoder signals.

20 Claims, 2 Drawing Sheets

STAGE SYSTEM AND LITHOGRAPHIC APPARATUS COMPRISING SUCH STAGE SYSTEM

CROSS REFERENCE TO RELATED APPLICATIONS

This application claims benefit under 35 U.S.C. §119(e) to U.S. Provisional Patent Application No. 61/065,000, filed Apr. 8, 2008, which is incorporated by reference in its entirety.

BACKGROUND

1. Field of the Invention

The present invention relates to a stage system, a lithographic apparatus including such stage system.

2. Background Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In recent developments in lithography, use is made of a stage system (including, e.g., a wafer stage or a mask stage), which is provided with an encoder system to measure a position of a movable part of the stage, such as the substrate support (e.g., wafer table) or patterning device support (e.g., mask table). Thereby, use may be made of encoder targets, such as grating plates, grid plates, etc. In some implementations, use may be made of a plurality of such encoder targets which are positioned adjacent to each other in order to, e.g., provide a larger measurement range as compared to a measurement range that would have been obtained with a single encoder target. Many considerations may result in such arrangements: it may for example be the case that production constraints limit a maximum achievable size of such encoder target, while a desired range of movement of the stage, and hence a desired measurement range, would exceed such size of the encoder target. Furthermore, it would be possible that the encoder targets would need to be provided around an element, such as a projection system, which would invoke a need to apply a plurality of encoder targets in order to surround the element.

When making use of a plurality of encoder targets, irregularities in the position measurement may occur when the stage moves from cooperating with one encoder target to cooperating with another one of the encoder targets. Thereby, a discontinuity, a step, an overlap or other effect may occur which may result in an inaccuracy of a position, movement, etc of the stage.

As an example, a transition from one encoder target to another one, each of the encoder targets having its own, associated error, may, when moving the stage from an area where sensor(s) of the stage cooperate with one encoder target, to an area where the sensors cooperate with the other encoder target, result in a disturbance of such stage movement as the position of the stage is determined first with reference to the one encoder target and then to the other encoder target.

SUMMARY

It is desirable to improve a lithographic apparatus stage position measurement.

According to an embodiment of the invention, there is provided a stage system including a moveable stage, at least two encoder heads, and a controller. The at least two encoder heads are each constructed to provide an encoder signal representative of a position of the movable stage with respect to an encoder target structure. The controller controls a position of the stage. The controller is provided with the encoder signals of each of the encoder heads. The controller is arranged apply a weighting function to the encoder signals and to derive a position of the stage from the weighted encoder signals.

In another embodiment of the invention, there is provided a lithographic apparatus including an illumination system, a patterning device support, a projection system, and a stage system. The illumination system is configured to condition a radiation beam. The patterning device support is constructed to support a patterning device capable of imparting the radiation beam with a pattern in its cross-section to form a patterned radiation beam; a substrate support constructed to hold a substrate. The projection system is configured to project the patterned radiation beam onto a target portion of the substrate. The stage system is configured to move one of the supports. The stage system includes a movable stage, at least two encoder heads each constructed to provide an encoder signal representative of a position of the movable stage with respect to an encoder target structure, and a controller to control a position of the stage. The controller is provided with the encoder signals of each of the encoder heads. The controller is arranged to apply a weighting function to the encoder signals and to derive a position of the stage from the weighted encoder signals.

In an embodiment of the invention, there is provided a device manufacturing method including the following steps. Patterning a radiation beam with a patterning device to form a patterned beam of radiation. The patterning device is supported by a patterning device support. Projecting the patterned beam of radiation onto a substrate, the substrate supported by a substrate support. Controlling a position of one of the supports, the controlling including providing at least two encoder signals that are each representative of a position of the support with respect to an encoder target structure. Applying a weighting function to the encoder signals; and deriving a position of the support from the weighted encoder signals.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
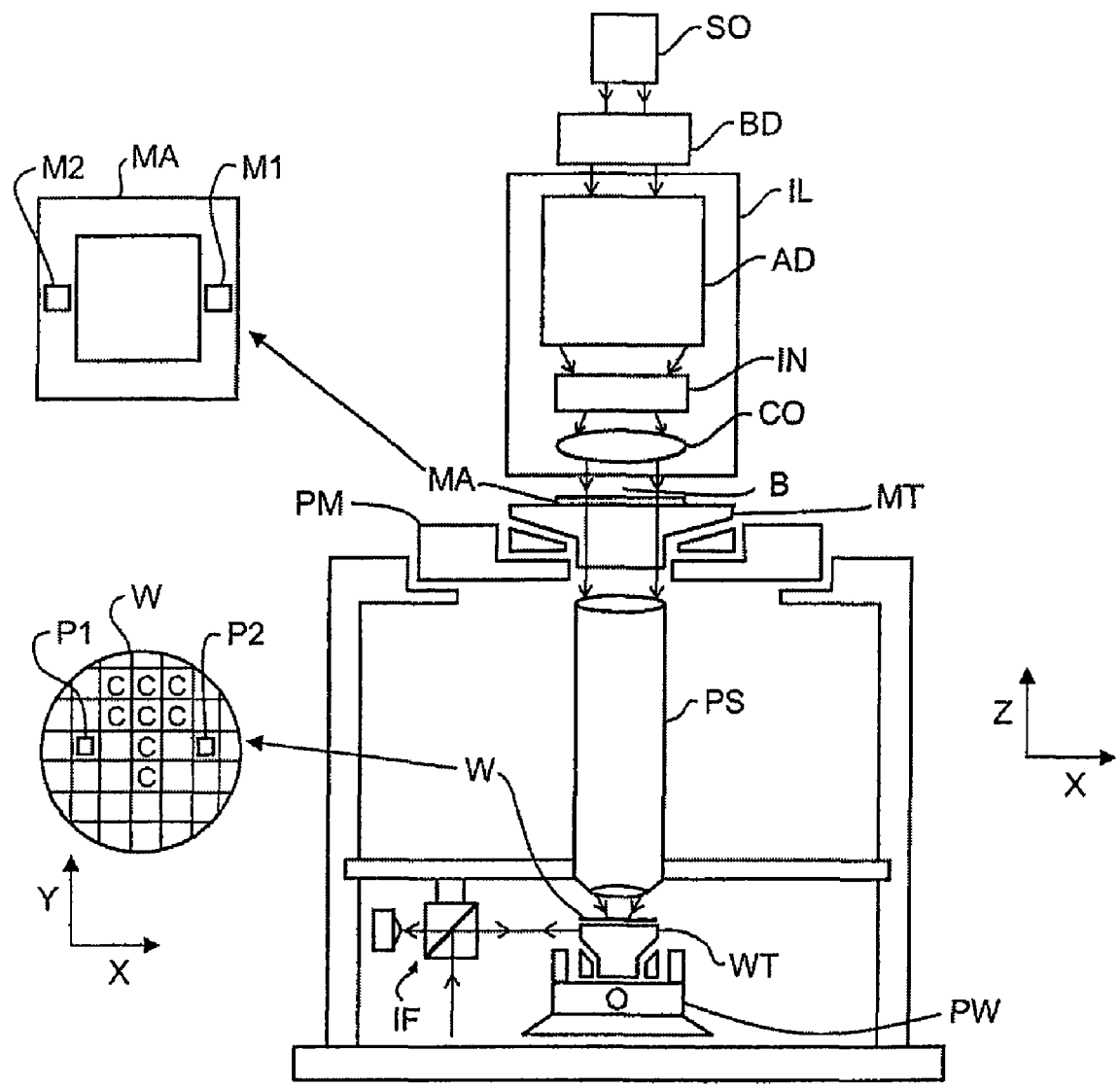
FIG. 1 depicts a lithographic apparatus, according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (i.e., a computing device). For example, a machine-readable medium may include read only memory (ROM); random access memory (RAM); magnetic disk storage media; optical storage media; flash memory devices; electrical, optical, acoustical or other forms of propagated signals (i.e., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the invention. The apparatus includes an illumination system (illuminator) IL configured to condition a radiation beam B (e.g., UV radiation or any other suitable radiation), a patterning device support or support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (i.e., mask) MA, which is held on the patterning device support (i.e., mask table) MT, and is patterned by the patterning device. Having traversed the patterning device (e.g., mask) MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed. Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies.

The depicted apparatus could be used in at least one of the following modes:

1. In step mode, the patterning device support (e.g., mask table) MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the patterning device support (e.g., mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device (e.g., mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
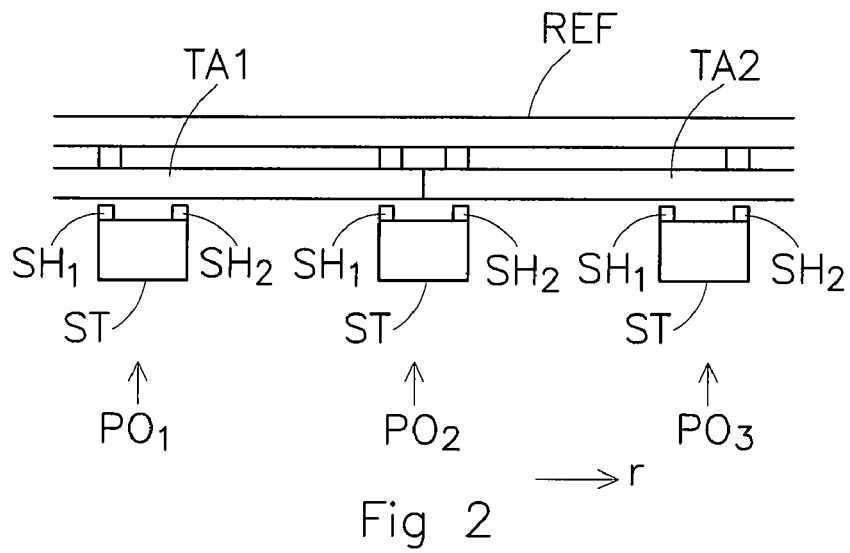
FIG. 2 depicts a schematic side view of a stage system, according to an embodiment of the invention.

FIG. 2 schematically depicts a stage system, according to an embodiment of the invention. The stage system includes a movable stage ST (such as a substrate stage or a patterning device stage), which is movable with respect to a reference structure REF (such as the metrology frame) to which encoder targets TA1, TA2 are attached. The encoder targets may be formed by plates having a grid, such as a one dimensional or two dimensional grid. Encoder heads, also referred to as sensor heads or measurement heads, which are connected to the stage are provided and in the example in FIG. 2 being indicated as SH1 and SH2 respectively.

In FIG. 2, the stage ST is depicted in 3 positions, e.g., a first position PO1 where the sensor heads are aimed at the first encoder target TA1, a second position PO2 where the stage is at a border between the first and second sensor targets TA1, TA2, and a third position PO3 where the sensor heads are aimed at the second encoder target. A control system or controller (not shown in FIG. 2) may be provided to control a position of the stage ST, the control system or controller may be provided with the position of the stage as measured by one or more of the sensor heads SH1, SH2. The sensor heads may each measure a position in a same dimension (degree of freedom). In the first position PO1 and from the first position moving towards the second position PO2 of the stage, a position of the stage as measured by the first sensor head SH1 is applied by the controller, while in the third position and from the third position moving towards the second position, the second sensor head SH2 is applied by the controller to provide position information. At and around position PO2, use may be made of the position output of both the first and second sensor heads SH1, SH2. Moving from the first to the second position, applying the first sensor SH1 provides for a continuous measurement of the position of the stage by SH1, avoiding discontinuities or other effects due to a changeover to SH2. The necessary changes having been made, the same holds for a movement of the stage from position PO3 to position PO2.

Figure 3:
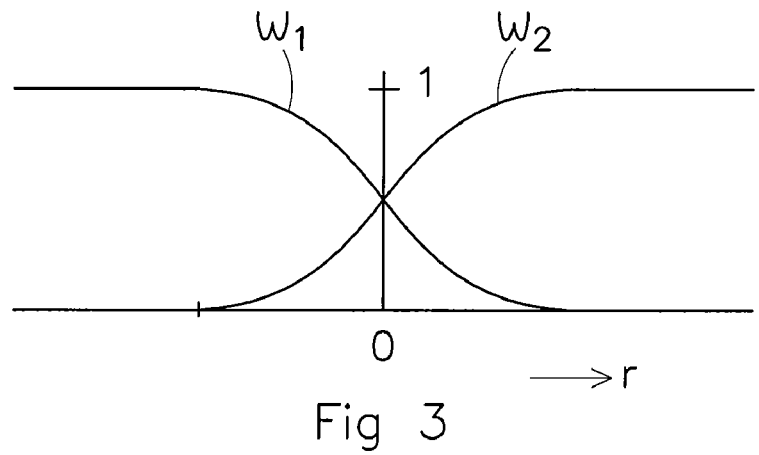
FIG. 3 depicts a schematic representation of a weighting function as applied in such a stage system, in accordance with an embodiment of the invention.

In order to avoid a discontinuity or other effect, a smooth transfer from one of the sensor heads SH1, SH2 to another one of the sensor heads SH1, SH2 is achieved by application of a weighting function, as for example in the embodiment of the present invention depicted in FIG. 3. The weighting function as depicted in FIG. 3 includes a first weighting curve $\omega 1$ to be applied to the position as measured by the first sensor head SH1 and a second weighting curve $\omega 2$ to be applied to the position as measured by the second sensor head SH2. The curves may be considered a weighting factor for the respective position signals from the respective sensor heads. In the example shown, at position r=0, both sensor head positions are taken into account equally, each for 0.5, while the more the stage is displaced to the left in the plane of drawing, the more weight put on the position signal as measured by the first sensor head and the less weight is put on the sensor head SH2 (the first sensor head being taken more into account than the second one). Moving the stage from r=0 to the right in the plane of the drawing, the opposite takes place. The position where r=0 is to be understood as to correspond to a position PO2 in FIG. 2, where the stage is at a border between the encoder targets.

It is noted that a horizontal scale in FIG. 2 does not necessarily correspond to a horizontal scale of drawing of FIG. 3. Furthermore, it is noted that the sensor heads SH1, SH2 may provide a one dimensional, two dimensional or any other suitable position signal. It is, for example, possible that the sensor heads provide an interferometer encoder combination which is arranged to measure a horizontal position (i.e., a position, e.g., along an axis in a plane formed by the direction r of FIG. 2 and an axis perpendicular to the plane of drawing) by an encoder readout and to measure a vertical position, i.e., distance of the sensor head SH1, SH2 to the encoder target TA1, TA2 by an interferometer readout. The weighting function may be applied to any one of such position signals. Also, it is to be understood that the weighting functions may be applied to all sensor signals provided by a sensor head (e.g., a two dimensional sensor head), or to one or more specific ones thereof. Furthermore, different weighting functions may be applied for different dimensions in order to take account of a geometric outline and borders of the encoder targets.

Figure 4:
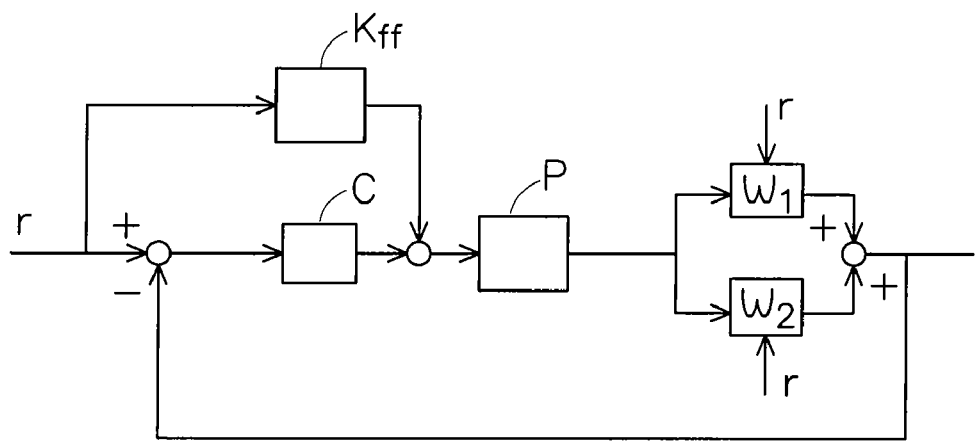
FIG. 4 depicts a control diagram including the weighting function, in accordance with an embodiment of the invention.

FIG. 4 depicts a control diagram in which the above weighting function is applied, according to an embodiment of the present invention. A combined feedforward/feedback controller is applied having a feedback loop formed by the controller C, process P and the weighting function. The process P represents a transfer function from an actuator drive signal of the stage to a position measurement signal as provided by the encoders. A feedforward is provided having a transfer function Kff which will be discussed in more detail below. As schematically depicted in FIG. 4, the weighting function is provided by the functions $\omega 1$ and $\omega 2$ connected in parallel, each of the weighting functions having an input to which the setpoint signal r is provided, so as to obtain the weighting function values corresponding to the desired position, e.g., according to the curves depicted in FIG. 3.

Instead of being dependent on the position setpoint signal of the stage, the weighting function may be dependent on any suitable variable, e.g., a time, a velocity of the stage, any other position signal of the stage as e.g., provided by any suitable position measurement device (which may include one or more of the encoder sensor heads or which may include any other position sensor to prevent potential stability problems), etc. It is however noted that a benefit of making use of the position setpoint signal is that it provides an adequate indication of the actual position of the stage, without invoking any disambiguities which could arise when one of more of the encoder head signals itself would be used, and furthermore providing a simple solution as the setpoint signal is available to the controller anyway. Still further, instability that could arise from using the weighted, measured position signals themselves to derive a value of the weighting function therefrom, may be avoided. In fact, applying the position setpoint signal, a time dependent weighting function is obtained, as the position setpoint includes a time sequence. In general, a time dependent weighting function may provide for a practical implementation, as the setpoint profiles of the stage position are time dependent, thereby being a function of time. The same may hold when applying the time, as the position of the stage relative to the encoder targets may, in accordance with a position setpoint profile of the stage, provide an adequate indication of the position of the stage, hence its position relative to the encoder targets.

According to a further embodiment of the invention, the feedforward path is provided with a transfer function which takes into account the weighting function. Thereby, a feedforward as close as possible to a theoretically optimal feedforward may be provided, as such theoretically optimal feedforward would have a transfer function including an (in addition to other terms) inverse of a combination of the process transfer function P and the weighting function.

$$K_{ff}(z, r) = \frac{1}{\sum_{i=1}^{N_m} \omega_i(r) \cdot P_i(z)}$$

In this expression, use may be made of separate models for the transfer function of the stage from stage actuator input signal to the respective sensor signal as provided by the encoder sensor heads. Thereby, different dynamic behavior of these transfer function (due to dynamics of the stage) may be taken into account.

Implementation of the above examples of the feedforward could however lead to potential instability, complex modeling as well as other factors, potential solutions of which will be discussed below.

According to a first example, use may be made of an inverse of a finite impulse response filter as an approximation of the transfer function of the stage. In order to provide the feedforward, the weighting function is applied to the inverse finite impulse response filter, the result of which being inverted again.

$$K_{ff}(z, r) = \frac{1}{\sum_{i=1}^{N_m} \omega_i(r) \cdot FIR_i(z)^{-1}}$$

Thereby, the transfer function of the feedforward path includes an inverse of a weighted inverse finite impulse response model.

Although a finite impulse response filter itself has the benefit of only having zero's, and providing a simply computable, relatively accurate approximation, and thus never becoming instable, this benefit may be lost since poles may occur in the above feedforward which may invoke stability problems.

Similarly as above, use may be made of an inverse autoregressive filter as an approximation of the transfer function of the stage, instead of the finite impulse response filter, thus providing that the transfer function of the feedforward path includes an inverse of a weighted inverse autoregressive model. Where in this document the term autoregressive model is applied, this is to be understood as an autoregressive moving average model (referred to as an ARMA model), autoregressive exogenous input model (referred to as an ARX model), etc. A benefit of making use of an autoregressive model is that it may provide for a more versatile modeling of the stage, i.e., the plant dynamics. On the other hand due to poles in the transfer function of the autoregressive filter model, additional instability issues may arise. An example of an autoregressive filter is provided by:

$$ARX_i(z) = \frac{B_i(z)}{A_i(z)} = \frac{b_0 + b_1 z^{-1} + \dots + b_{N_{FIR}-1} z^{N_{FIR}-1}}{1 + a_1 z^{-1} + \dots + a_{N_{FIR}} z^{N_{FIR}-1}}$$

According to a third example, a more simple and stable feedforward may be obtained by the below simplification, where use may be made of a finite impulse response filter as an approximation of the inverse stage transfer function, the weighting function being applied to the Finite impulse response filters itself.

$$K_{ff}(z, r) = \sum_{i=1}^{N_m} \omega_i(r) \cdot FIR_i(z)$$

Thus, the transfer function of the feedforward path includes a weighted finite impulse response model. Such a feedforward may easily be implemented, as it may be formed by two parallel paths, each having a weighting function, the outputs of the paths being summed. Furthermore, the above described instability problems may be avoided.

A similar effect may be obtained using an autoregressive filter, which may result in the below transfer function $$K_{ff}(z, r) = \sum_{i=1}^{N_m} \omega_i(r) \cdot ARX_i(z)$$

where the ARX function provides an autoregressive filter. Compared with the above weighted finite impulse response model, a more versatile modeling may be provided possible enabling a more versatile modeling of the plant transfer function (i.e., in this example the stage transfer function).

Although all further embodiments are described in relation to the feedforward path it will be acknowledged by the skilled person that the described invention may also be advantageous within the feedback loop formed by the controller C, process P and the weighting function. In further embodiments it may be advantageous to arrange the controller to apply a weighting function only in the feedback loop, only in the feedforward path or a combination thereof or to apply a separate weighting function for the feedback loop and a separate weighting function for the feedforward path.

It will be acknowledged by the skilled person that in case the transfer function of the feedback loop changes more drastically as a function of the position of the movable stage it may be advantageous to derive a specific controller setting for such positions where the specific controller settings of the feedback loop is synchronized with the position of the stage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A stage system comprising:
    a movable stage;
    at least two encoder heads connected to the moveable stage and each configured to provide an encoder signal representative of a position of the movable stage with respect to an encoder target structure comprising at least two adjacent grid plates; and
    a controller configured to:
        control a position of the stage, the controller being provided with the encoder signals of each of the encoder heads,
        apply a weighting function to the encoder signals as the stage moves between the adjacent grid plates, and
        determine a position of the stage based on the weighted encoder signals,
        wherein the weighting function minimizes a measurement discontinuity from the encoder signals.

2. The stage system according to claim 1, wherein the weighting function is dependent on a position signal of the stage.

3. The stage system according to claim 2, wherein the position signal comprises a position setpoint signal.

4. The stage system according to claim 1, wherein the weighting function is dependent on the position of the stage along the adjacent grid plates and is substantially symmetrical with respect to a border between the adjacent grid plates.

5. The stage system according to claim 1, wherein the controller comprises a feedforward path, the feedforward path having a transfer function that approximates an inverse of a weighted transfer function of the stage, the transfer function including a transfer function of the stage and the weighting function.

6. The stage system according to claim 5, wherein the transfer function of the feedforward path comprises an inverse of a weighted inverse finite impulse response model.

7. The stage system according to claim 5, wherein the transfer function of the feedforward path comprises a weighted finite impulse response model.

8. The stage system according to claim 5, wherein the transfer function of the feedforward path comprises an inverse of a weighted inverse autoregressive model.

9. The stage system according to claim 5, wherein the transfer function of the feedforward path comprises a weighted autoregressive model.

10. A lithographic apparatus comprising:
    a patterning device support configured to support a patterning device, the patterning device configured to impart a radiation beam with a pattern in its cross-section to form a patterned beam;
    a substrate support configured to hold a substrate;
    a projection system configured to project the patterned beam onto a target portion of the substrate; and
    a stage system configured to move one of the supports, the stage system including,
        a movable stage,
        at least two encoder heads connected to the movable stage and each constructed to provide an encoder signal representative of a position of the movable stage with respect to an encoder target structure comprising at least two adjacent grid plates, and
        a controller configured to:
            control a position of the stage, the controller being provided with the encoder signals of each of the encoder heads,
            apply a weighting function to the encoder signals as the stage moves between the adjacent grid plates, and
            determine a position of the stage based on the weighted encoder signals,
            wherein the weighting function minimizes a measurement discontinuity from the encoder signals.

11. The lithographic apparatus according to claim 10, wherein the weighting function is dependent on a position signal of the stage.

12. The lithographic apparatus according to claim 11, wherein the position signal comprises a position setpoint signal.

13. The lithographic apparatus according to claim 10, wherein the encoder target structure comprises at least two adjacent grid plates, the weighting function being dependent on the position of the stage along the grid plates and being substantially symmetrical with respect to a border between the grid plates.

14. The lithographic apparatus according to claim 11, wherein the controller comprises a feedforward path, the feedforward path having a transfer function that approximates an inverse of a weighted transfer function of the stage, the transfer function including a transfer function of the stage and the weighting function.

15. The lithographic apparatus according to claim 14, wherein the transfer function of the feedforward path comprises an inverse of a weighted inverse finite impulse response model.

16. The lithographic apparatus according to claim 14, wherein the transfer function of the feedforward path comprises a weighted finite impulse response model.

17. The lithographic apparatus according to claim 14, wherein the transfer function of the feedforward path comprises an inverse of a weighted inverse autoregressive model.

18. The lithographic apparatus according to claim 14, wherein the transfer function of the feedforward path comprises a weighted autoregressive model.

19. A device manufacturing method comprising:
   patterning a radiation beam with a patterning device, supported by a patterning device support, to form a patterned beam of radiation;
   projecting the patterned beam of radiation onto a substrate, the substrate supported by a substrate support; and
   controlling a position of one of the supports, the controlling including,
   providing at least two encoder signals from at least two encoder heads connected to one of the supports that are each representative of a position of one of the supports with respect to an encoder target structure including at least two adjacent grid plates,
   applying a weighting function to the encoder signals as the support with the connected encoder heads moves between the adjacent grid plates, wherein the weighting function minimizes a measurement discontinuity from the encoder signals, and
   determining a position of the support with the connected encoder heads based on the weighted encoder signals.

20. The method according to claim 19, wherein the weighting function is dependent on a position signal of the stage.

* * * * *